United States Patent
Jones et al.

(10) Patent No.: US 10,488,435 B2
(45) Date of Patent: Nov. 26, 2019

(54) HEAT RESISTANT, NON-CONDUCTIVE THREADED SUPPORT GUIDE FOR USE IN FAILURE TESTING AND FAILURE TESTING METHOD USING SAME

(71) Applicants: BSH Home Appliances Corporation, Irvine, CA (US); BSH Hausgeräte GmbH, Munich (DE)

(72) Inventors: Robert Jones, New Bern, NC (US); Shaun Jones, New Bern, NC (US)

(73) Assignees: BSH Home Appliance Corporation, Irvine, CA (US); BSH Hausgeräte GmbH, Munich (DE)

( * ) Notice: Subject to any disclaimer, the term of this patent is extended or adjusted under 35 U.S.C. 154(b) by 261 days.

(21) Appl. No.: 15/728,528

(22) Filed: Oct. 10, 2017

(65) Prior Publication Data

US 2019/0107555 A1    Apr. 11, 2019

(51) Int. Cl.
| | |
|---|---|
| *G01R 21/02* | (2006.01) |
| *G01R 1/04* | (2006.01) |
| *G01R 31/28* | (2006.01) |

(52) U.S. Cl.
CPC ........... *G01R 1/04* (2013.01); *G01R 31/2875* (2013.01)

(58) Field of Classification Search
CPC . G01R 1/04; G01R 1/44; G01R 21/14; G01R 31/2875; G01N 25/18; G01N 25/72; G01N 27/14; G01N 27/18
See application file for complete search history.

(56) References Cited

U.S. PATENT DOCUMENTS 7,459,053 B2 *   12/2008   Bone, Jr. ................... C09J 5/06
156/272.2

* cited by examiner

*Primary Examiner* — Minh N Tang
(74) *Attorney, Agent, or Firm* — Michael E. Tschupp; Andre Pallapies; Brandon G. Braun

(57) ABSTRACT

A support guide is provided for supporting a delicate heating wire in a failure test. The support guide includes a body formed of a heat resistant, non-conductive material. The body has a threaded surface configured to receive and support the delicate heating wire in a coiled form. Also provided is a failure testing method using the heat resistant, non-conductive threaded support guide.

20 Claims, 5 Drawing Sheets

HEAT RESISTANT, NON-CONDUCTIVE THREADED SUPPORT GUIDE FOR USE IN FAILURE TESTING AND FAILURE TESTING METHOD USING SAME

FIELD OF THE INVENTION

The present invention relates generally to failure testing and, more particularly, to a heat resistant, non-conductive threaded support guide for use in failure testing and a failure testing method using the heat resistant, non-conductive threaded support guide.

BACKGROUND OF THE INVENTION

In general, current testing procedures in accordance with Underwriters Laboratories (UL) use a delicate heating wire, such as Nichrome wire, and subject the test specimen or device under test (DUT) to thermal and physical stress during forced failure tests. During the test, the DUT, which can be a household appliance such as a dishwasher, an electrical component, and plastic housings enclosing such electrical components and various parts, etc., is deliberately subjected to thermal and physical stress by varying the current in a test circuit, such that the low resistance Nichrome wire is heated. The goal is to observe any failure in the DUT.

SUMMARY OF THE INVENTION

Under current testing procedures, there is no requirement to support the delicate heating wire or Nichrome wire. The typical practice is to leave the Nichrome wire hanging in open air or have it sitting on a surface free to move and/or bend during testing. However, while failure testing the DUT, it is possible for the delicate Nichrome heating wire to move, bend, and/or break due to stressing while being heated, as the Nichrome wire is heated to a temperature of from 1200° F. to 1500° F. It is also possible for the delicate Nichrome heating wire to bend and short. All of these deleterious conditions will cause the test procedure to fail without obtaining any useful data. This in turn increases the time and cost as it is not always possible to reuse the DUT.

In fact, the set-up for failure testing a new dishwasher as the DUT, for example, may take up to half of a day and 2-3 hours at the very least. In such a failure test, the entire dishwasher is wrapped with cloth, such as cheesecloth, surrounded by a fireproof material, and then connected to the test circuit for failure testing. The actual test may take only about 20 minutes. The goal is to run the failure test and determine if the DOT has failed the test or passed the test. A failure of the test by the dishwasher, for example, would be exemplified by the cheesecloth showing evidence of burning or ignition escaping due to overheating of a particular component of the dishwasher. However, if after the failure testing, the Nichrome wire did not heat properly and shows evidence of moving, bending, and/or breaking due to stressing while being heated, then the entire test procedure must be scrapped and a whole new test procedure set-up again requiring hours of additional work. In this regard, there is no way to know whether the failure test was successful until after the entire failure test has been performed and the Nichrome wire can be removed from the dishwasher and inspected along with the DUT.

Also, under current procedure, the Nichrome wire is pre-coiled around a form such as a metal screw, and then the metal screw must be removed prior to activating the coiled Nichrome wire in the test circuit, in order to prevent shorting.

An apparatus consistent with the present disclosure is directed to providing a heat resistant, non-conductive threaded support guide for failure testing.

An apparatus consistent with the present disclosure is directed to providing a heat resistant, non-conductive support guide for failure testing comprising a threaded rod for supporting the delicate heating wire.

An apparatus consistent with the present disclosure decreases the set-up time for setting up a failure test to test a DUT by, for example, eliminating the need to pre-coil the delicate Nichrome wire around a metal screw and the having to remove the screw before running the failure test.

An apparatus consistent with the present disclosure provides a heat resistant, non-conductive support guide for supporting a coil of the delicate Nichrome heating wire while under failure test, thereby preventing the delicate Nichrome heating wire from moving, bending, and/or breaking due to stressing while being heated which would in turn void the failure test.

According to one aspect, the present disclosure provides a support guide for supporting a heating wire in a failure test. The support guide includes a body formed of a heat resistant, non-conductive material. The body has a threaded surface configured to receive and support the heating wire in a coiled form.

According to another aspect, the body comprises an elongated member having the threaded surface.

According to another aspect, the body comprises a rod having the threaded surface.

According to another aspect, the heat resistant, non-conductive material comprises ceramic.

According to another aspect, the ceramic comprises YZ zirconia.

According to another aspect, the heating wire comprises a Nichrome wire.

According to another aspect, the Nichrome wire comprises 80% nickel, 20% chrome, and is 22 American Wire Gauge (AWG) in diameter.

According to another aspect, the threaded surface comprises a thread having a TPI (threads per inch) of 8.

According to another aspect, the threaded surface comprises a thread having a pitch, a minor diameter, and a major diameter for supporting a coil of the heating wire while under failure test.

According to another aspect, the pitch is 60 degrees, the minor diameter is 0.09 inches, and the major diameter is 0.15 inches.

According to another aspect, the threaded surface of the rod comprises a thread having a pitch, a minor diameter, and a major diameter for supporting a coil of the heating wire while under failure test.

A method consistent with the present disclosure is directed to providing a failure testing method using the heat resistant, non-conductive threaded support guide.

According to one aspect, the present disclosure provides a failure testing method using the heat resistant, non-conductive threaded rod.

According to another aspect, the present disclosure provides a failure testing method for testing a device under test (DUT), the method comprising: providing a support guide for supporting a heating wire, the support guide including a body formed of a heat resistant, non-conductive material, and the body having a threaded surface configured to receive and support the heating wire in a coiled form; coiling the heating wire on the threaded surface of the body of the support guide; connecting the heating wire supported by the support guide with a power supply in a failure test circuit; and varying a current on the heating wire to heat the heating wire and thereby subject the DUT to thermal and physical stress.

According to another aspect, in the failure testing method, the body comprises a rod having the threaded surface.

According to another aspect, in the failure testing method, the heat resistant, non-conductive material comprises ceramic.

According to another aspect, in the failure testing method, the ceramic comprises YZ zirconia.

According to another aspect, in the failure testing method, the heating wire comprises a Nichrome wire.

According to another aspect, in the failure testing method, the Nichrome wire comprises 80% nickel, 20% chrome, and is 22 AWG in diameter.

According to another aspect, in the failure testing method, the threaded surface comprises a thread having a TPI of 8.

According to another aspect, in the failure testing method, the threaded surface comprises a thread having a pitch, a minor diameter, and a major diameter for supporting the coiled heating wire while under failure test.

According to another aspect, in the failure testing method, the pitch is 60 degrees, the minor diameter is 0.09 inches, and the major diameter is 0.15 inches.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE EXEMPLARY EMBODIMENTS

The exemplary embodiments set forth below represent the necessary information to enable those skilled in the art to practice the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Moreover, it should be understood that terms such as side, bottom, front, rearward, upper, lower, upward, downward, and the like used herein are for orientation purposes with respect to the drawings when describing the exemplary embodiments and should not limit the present invention.

Figure 1:
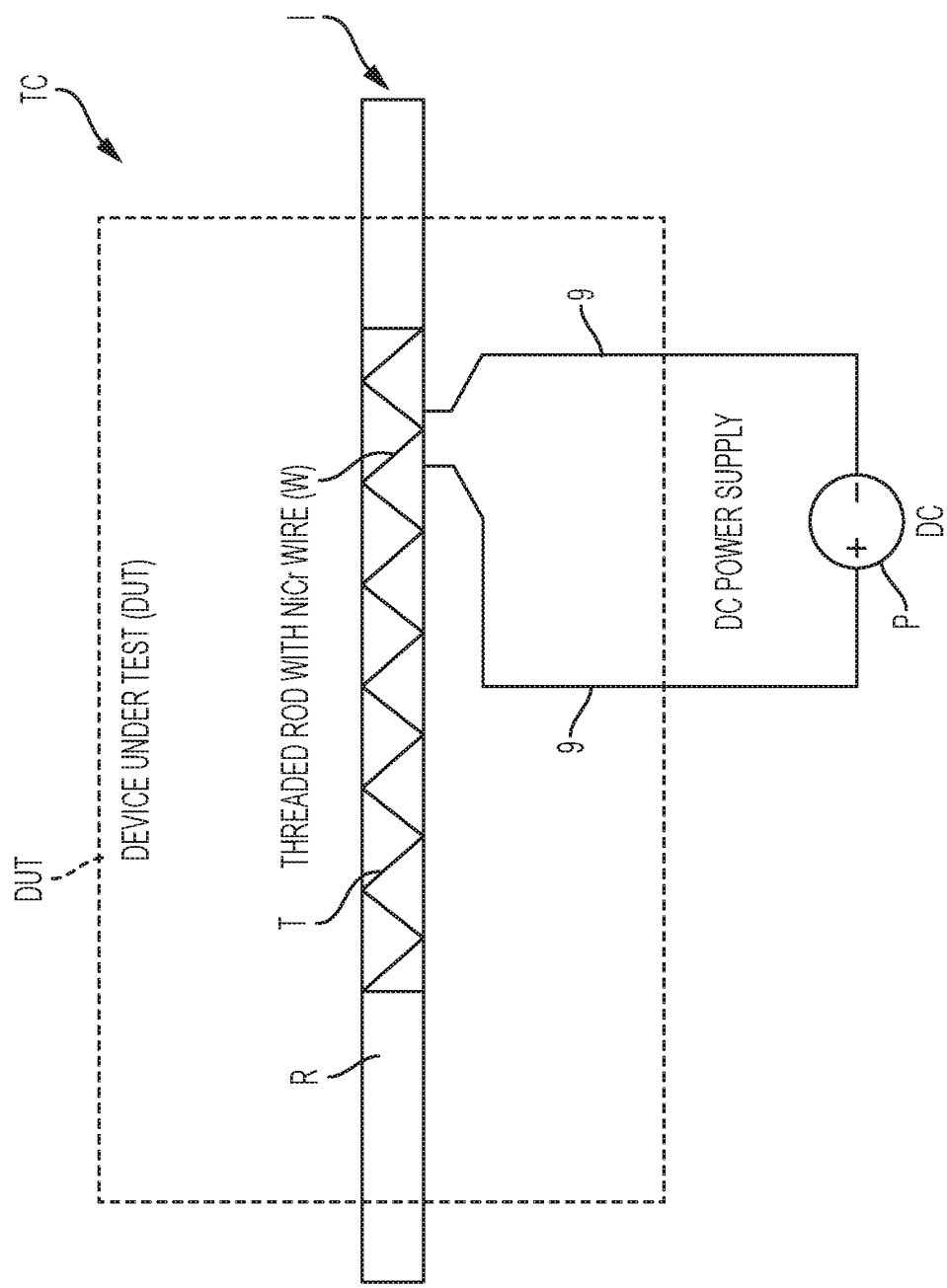
FIG. 1 is a schematic diagram of a test circuit for failure testing including the threaded ceramic rod having a heating wire such as a Nichrome wire coiled around the threads and supported by the ceramic rod according to an exemplary embodiment consistent with present disclosure.

FIG. 1 is a schematic diagram of a failure test circuit TC for failure testing including a heat resistant, non-conductive threaded support guide 1 such as, but not limited to, a threaded ceramic rod R having a delicate heating wire W such as, but not limited to, a Nichrome wire coiled around the threads T and supported by the ceramic rod R according to an exemplary embodiment consistent with present disclosure. In particular, the Nichrome wire W (see also FIG. 3) which is coiled around the threads T (see also FIG. 2) and supported by the ceramic rod R is connected to a DC power supply P. The DC power supply P is preferably a laboratory power source having manual dials which allow a technician the ability to vary the voltage and the current by changing the dial settings. For example, the technician may increase the current on the low resistance Nichrome wire W to thereby heat the Nichrome wire W to between 1200° F. to 1500° F. As will be discussed in more detail below, the Nichrome wire W coiled around the threads T of the ceramic rod R is, for example, substituted for a neutral wire of the DUT and then passed through an opening in the DUT. The goal is to run the failure test and determine if the DOT has failed the test or passed the test. A failure of the test by the dishwasher, for example, would be exemplified by the cheesecloth showing evidence of burning or ignition due to overheating of a particular component of the dishwasher.

Figure 2:
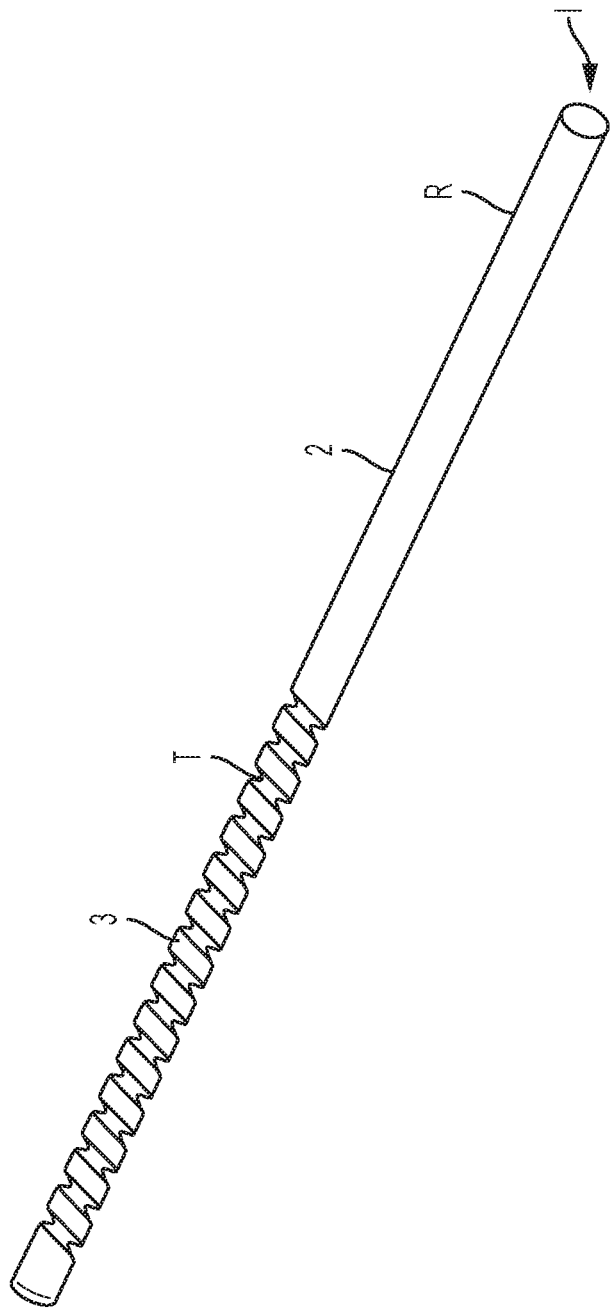
FIG. 2 is a perspective view of a heat resistant, non-conductive threaded support guide such as a threaded ceramic rod according to an exemplary embodiment consistent with present disclosure.

FIG. 2 is a perspective view of the heat resistant, non-conductive threaded support guide 1 per se such as, but not limited to, a threaded ceramic rod R according to an exemplary embodiment consistent with present disclosure. In particular, the heat resistant, non-conductive threaded support guide 1 comprises a body 2 in the form of an elongated member or rod R having a threaded surface 3 with threads T configured to receive and support the heating wire W in a coiled form, as will be discussed in more detail below.

The heat resistant, non-conductive material forming the support guide 1 preferably comprises ceramic. The term "ceramic" as used herein refers to an inorganic, non-metallic, often crystalline oxide, nitride, or carbide material and includes materials such as, but not limited to, carbon, silicon, kaolinite, glass, porcelain, alumina, silicon carbide, tungsten carbide, silicon nitride, sialon, zinc oxide, zirconium dioxide, YZ zirconia, barium titanate, and composites thereof. The ceramic used to form the threaded rod R of the support guide 1 is preferably, but not necessarily, YZ zirconia.

The threaded surface 3 comprises the thread T having a pitch, a minor diameter, and a major diameter for supporting a coil of the heating wire W while under failure test. Preferably, but not necessarily, the pitch of the thread T is 60 degrees, the minor diameter is 0.09 inches, the major diameter is 0.15 inches, and the thread T has a TPI (threads per inch) of 8.

As noted above, the delicate heating wire W may comprise a Nichrome wire. The "Nichrome wire" preferably, but not necessarily, comprises 80% nickel, 20% chrome, and is 22 American Wire Gauge (AWG) in diameter, in accordance with American Society for Testing and Materials (ASTM) 344.

Figure 3:
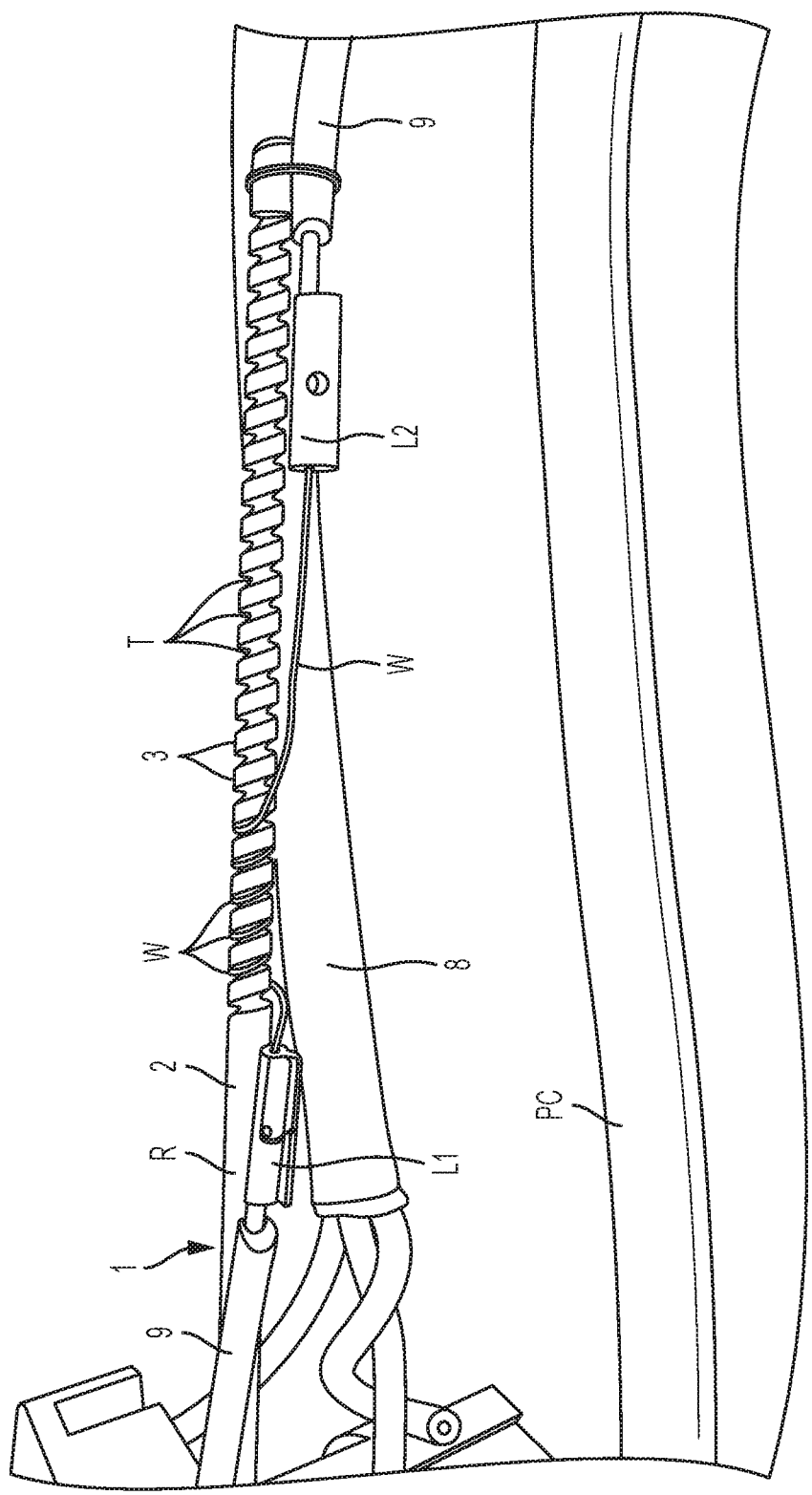
FIG. 3 is a side perspective view of the threaded ceramic rod having a heating wire such as a Nichrome wire coiled around the threads and supported by the ceramic rod according to an exemplary embodiment consistent with present disclosure.

FIG. 3 is a side perspective view of the heat resistant, non-conductive threaded support guide 1 in the form of the threaded ceramic rod R having a low resistance Nichrome wire W coiled around the threads T and supported by the ceramic rod R according to an exemplary embodiment consistent with present disclosure. The low resistance Nichrome wire W coiled around the threads T is connected at one end via a first lead L1 and a second lead L2 to the positive and negative terminals of the DC power supply P (see FIG. 1).

Figure 4:
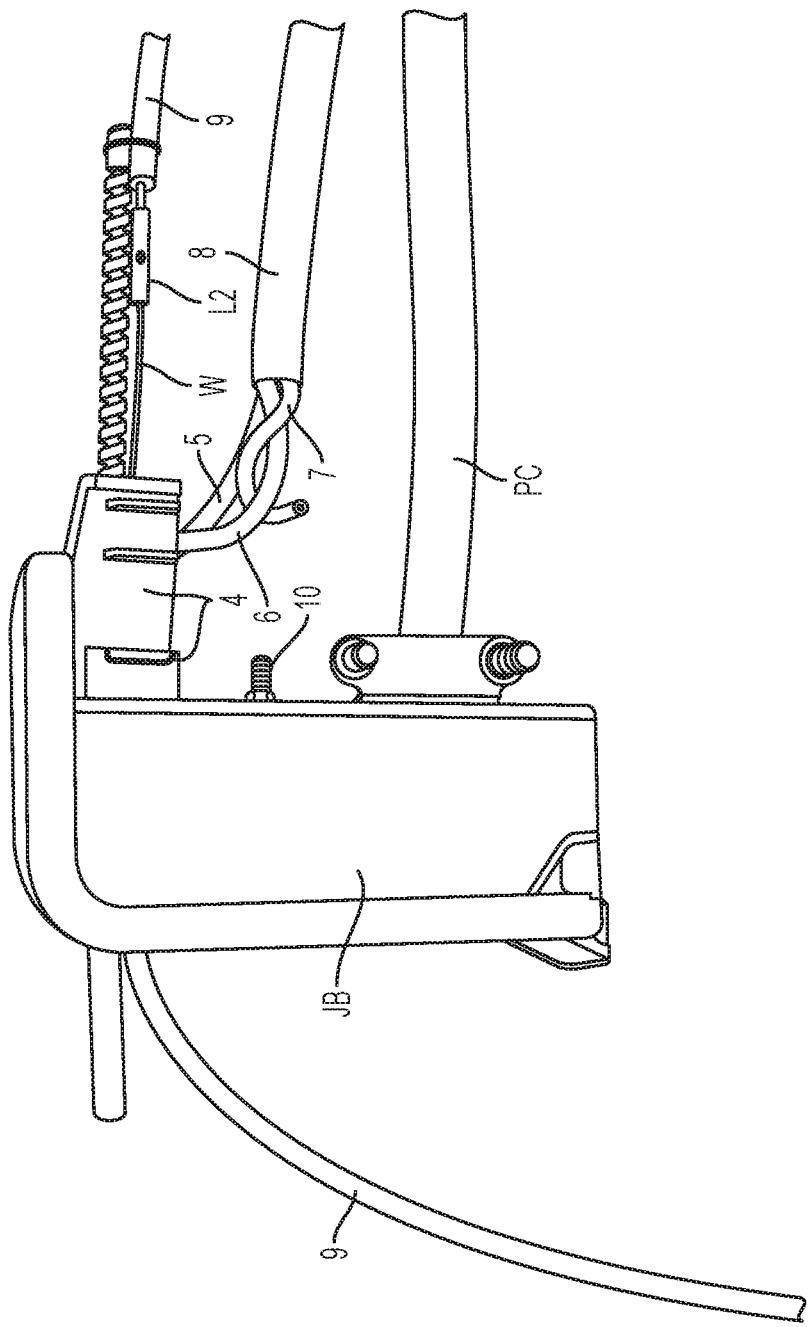
FIG. 4 is a side perspective view of the test assembly according to an exemplary embodiment consistent with present disclosure.
Figure 5:
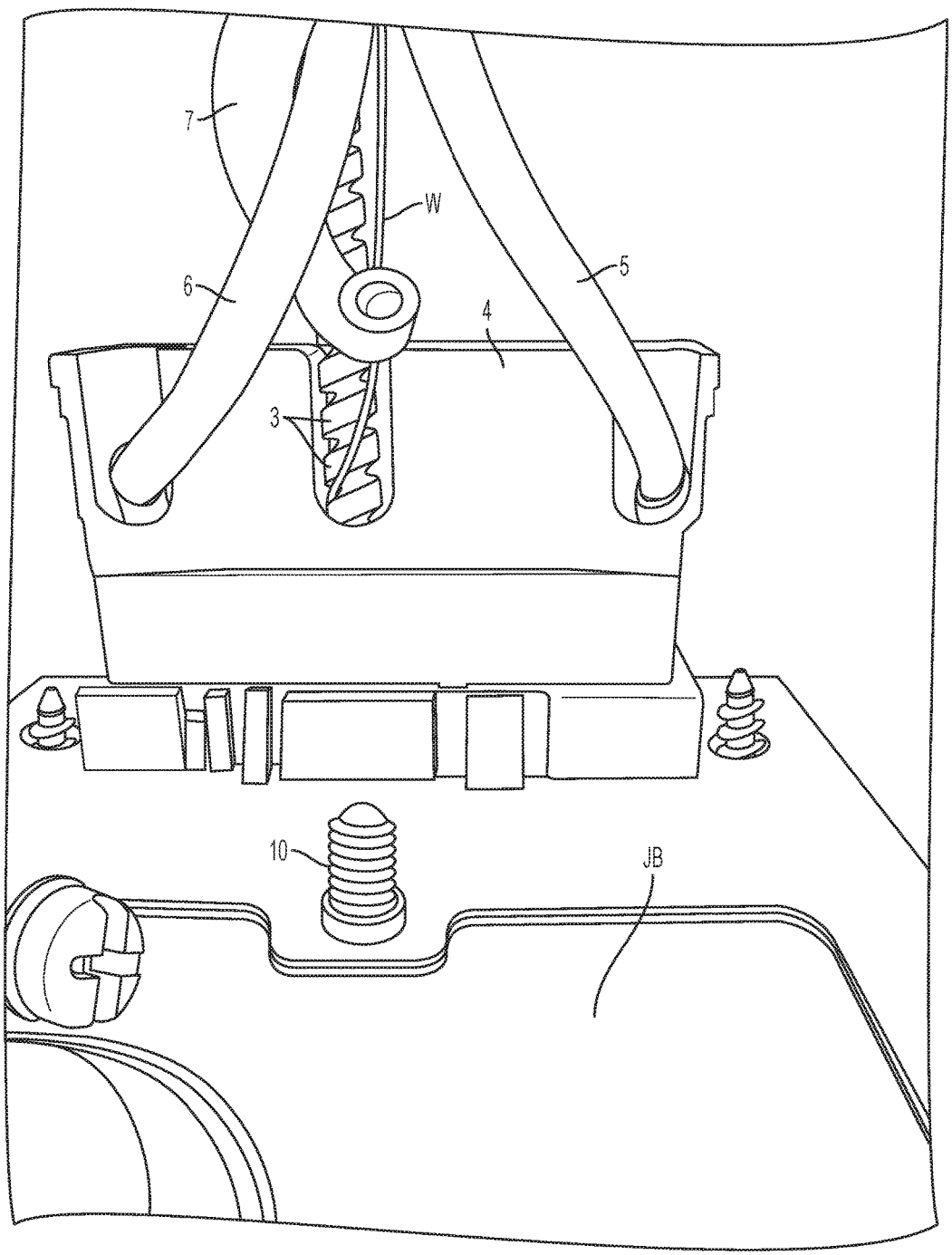
FIG. 5 is a bottom perspective view of the test assembly according to an exemplary embodiment consistent with present disclosure.

FIG. 4 is a side perspective view and FIG. 5 is a bottom perspective view of the test assembly according to an exemplary embodiment consistent with present disclosure. In particular, as shown in FIG. 4, a junction box JB is connected via a power cord PC to a standard AC power outlet, for example, the household wall outlet (not shown). The junction box JB is normally mounted in the base portion of the dishwasher such as at a front portion of the dishwasher (not shown). In this case, the junction box JB is shown outside of the dishwasher for ease of understanding. The junction box JB has a terminal block 4 which in this example is the DUT. The terminal block 4 is shown with three wires 5, 6, and 7, where the wire 5 is a power or hot wire, the wire 6 is a ground wire, and the wire 7 is a neutral wire. The three wires 5, 6, and 7 are covered with a sheath 8 and the end (not shown) is connected to the main controller (not shown) of the dishwasher. As shown in FIG. 4, a portion of the Nichrome wire W and the second lead L2 are visible and the second lead L2 is connected to a high temperature wire 9 that in turn is connected to the DC power supply P (see FIG. 1). In this instance, since the neutral wire 7 is not required for operation of the dishwasher, the neutral wire 7 is cut and the Nichrome wire W coiled around the threads T and supported by the ceramic rod R is substituted for the neutral wire 7. Preferably, but not necessarily, the Nichrome wire W coiled around the threads T and supported by the ceramic rod R is inserted through a hole drilled through the terminal block 4 and the junction box JB.

FIG. 5 shows the terminal block 4 from the bottom with the Nichrome wire W coiled around the threads T and supported by the ceramic rod R being inserted into position within the drilled hole in the terminal block 4 and then through the junction box JB. FIG. 3 shows the Nichrome wire W coiled around the threads T and supported by the ceramic rod R prior to being inserted into the drilled hole, whereas FIG. 4 shows the terminal block 4 from the side with the Nichrome wire W coiled around the threads T and supported by the ceramic rod R after being inserted into the drilled hole. As shown in FIGS. 4 and 5, the threaded stud 10 is for attaching the junction box to the dishwasher at the base portion at a front portion thereof.

The operation of the Nichrome wire W coiled around the threads T and supported by the ceramic rod R when used during a failure test procedure will now be described. In particular, the Nichrome heating wire W is coiled on the threaded surface 3 of the body 2 of the support guide 1. The Nichrome wire W coiled around the threads T and supported by the ceramic rod R is then passed through the drilled opening or hole in the terminal block 4 and the junction box JB. The Nichrome wire W supported by the support guide 1 is connected with the DC power supply P in the failure test circuit TC. The junction box JB is then fastened into position at the base portion at a front portion of the dishwasher using the threaded stud 10 and a fastener (not shown). The door of the dishwasher and any base plate is disposed in its normal position. The dishwasher is then completely encased in cheesecloth and then enclosed with a fireproof material. The technician conducting the test then increases the current using the manual dials on the DC power supply P to heat up the Nichrome wire W coiled on the threads T of the ceramic support rod R in order to simulate a faulty connection in the terminal block 4 of the dishwasher. The Nichrome wire W is heated up to between 1200° F. to 1500° F. for 20 minutes. After the 20 minutes has elapsed, the cheesecloth is inspected to determine if any burn marks or scorching marks are visible thereby indicating that the terminal block 4 has, for example, overheated and melted or was burning in such a manner as to leave the confines of the dishwasher.

Consistent with the present disclosure, the heat resistant, non-conductive support guide 1 effectively supports the coil of the delicate Nichrome heating wire W while under failure test, thereby preventing the delicate Nichrome heating wire W from moving, bending, and/or breaking due to stressing while being heated which would in turn void the failure test.

The present invention has substantial opportunity for variation without departing from the spirit or scope of the present invention. For example, the support guide 1 for supporting a heating wire W in a failure test is not limited for use with the above-described terminal block 4 of a junction box JB of a dishwasher, but can be used to perform failure testing of other components, such as but not limited to, terminal blocks, relays and other electrical components with contacts or connectors.

Those skilled in the art will recognize improvements and modifications to the exemplary embodiments of the present invention. All such improvements and modifications are considered within the scope of the concepts disclosed herein and the claims that follow.

What is claimed is:

1. A support guide for supporting a heating wire in a failure test, the support guide comprising:
    a body formed of a heat resistant, non-conductive material;
    wherein the body comprises a threaded surface configured to receive and support the heating wire in a coiled form.

2. The support guide of claim 1, wherein the body comprises an elongated member having the threaded surface.

3. The support guide of claim 1, wherein the body comprises a rod having the threaded surface.

4. The support guide of claim 3, wherein the threaded surface of the rod comprises a thread having a pitch, a minor diameter, and a major diameter for supporting a coil of the heating wire while under failure test.

5. The support guide of claim 1, wherein the heat resistant, non-conductive material comprises ceramic.

6. The support guide of claim 5, wherein the ceramic comprises YZ zirconia.

7. The support guide of claim 1, wherein the heating wire comprises a Nichrome wire.

8. The support guide of claim 7, wherein the Nichrome wire comprises 80% nickel, 20% chrome, and is 22 American Wire Gauge (AWG) in diameter.

9. The support guide of claim 1, wherein the threaded surface comprises a thread having a TPI (threads per inch) of 8.

10. The support guide of claim 1, wherein the threaded surface comprises a thread having a pitch, a minor diameter, and a major diameter for supporting a coil of the heating wire while under failure test.

11. The support guide of claim 10, wherein the pitch is 60 degrees, the minor diameter is 0.09 inches, and the major diameter is 0.15 inches.

12. A failure testing method for testing a device under test (DUT), the method comprising:

providing a support guide for supporting a heating wire, the support guide including a body formed of a heat resistant, non-conductive material, and the body having a threaded surface configured to receive and support the heating wire in a coiled form;

coiling the heating wire on the threaded surface of the body of the support guide;

connecting the heating wire supported by the support guide with a power supply in a failure test circuit; and varying a current on the heating wire to heat the heating wire and thereby subject the DUT to thermal and physical stress.

13. The failure testing method of claim 12, wherein the body comprises a rod having the threaded surface.

14. The failure testing method of claim 12, wherein the heat resistant, non-conductive material comprises ceramic.

15. The failure testing method of claim 12, wherein the ceramic comprises YZ zirconia.

16. The failure testing method of claim 12, wherein the heating wire comprises a Nichrome wire.

17. The failure testing method of claim 16, wherein the Nichrome wire comprises 80% nickel, 20% chrome, and is 22 American Wire Gauge (AWG) in diameter.

18. The failure testing method of claim 12, wherein the threaded surface comprises a thread having a TPI (threads per inch) of 8.

19. The failure testing method of claim 12, wherein the threaded surface comprises a thread having a pitch, a minor diameter, and a major diameter for supporting the coiled heating wire while under failure test.

20. The failure testing method of claim 19, wherein the pitch is 60 degrees, the minor diameter is 0.09 inches, and the major diameter is 0.15 inches.

* * * * *